Figure 1:
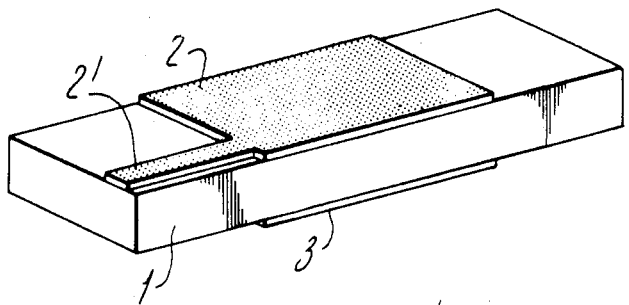

United States Patent [19]

Milsom

[11] Patent Number: 4,583,063

[45] Date of Patent: Apr. 15, 1986

[54] PIEZO-ELECTRIC RESONATOR OR FILTER HAVING SLOTS FORMED WHICH IMPEDE UNDESIRED VIBRATIONAL ENERGY

[75] Inventor: Robert F. Milsom, Redhill, England

[73] Assignee: U.S. Philips Corporation, New York, N.Y.

[21] Appl. No.: 505,603

[22] Filed: Jun. 20, 1983

[30] Foreign Application Priority Data

Jul. 16, 1982 [GB] United Kingdom ............... 8220703

[51] Int. Cl.⁴ .............................................. H03H 9/17
[52] U.S. Cl. ................................... 333/187; 310/367; 310/368
[58] Field of Search .................... 333/187, 188, 189; 310/367, 368, 365, 361, 333

[56] References Cited

U.S. PATENT DOCUMENTS

| | | | |
|---|---|---|---|
| 3,143,672 | 8/1964 | Mason | 310/367 X |
| 3,646,413 | 9/1970 | Oomen | 310/367 X |
| 4,076,987 | 2/1978 | Zumsteg | 310/361 |

Primary Examiner—Eugene R. LaRoche
Assistant Examiner—Benny T. Lee
Attorney, Agent, or Firm—Robert T. Mayer; Bernard Franzblau

[57] ABSTRACT

A resonator or filter which comprises a bar (1) of piezo-electric material provided with electrodes (2,3) which are spaced from the two ends of the bar. In operation, thickness shear vibrations occur between the electrodes and the bar width to thickness ratio is such that said vibrations in turn produce Nth harmonic flexure vibrations which propagate across the bar width, N being an even number. In order to accelerate the rate of decay of the vibrations towards the (supported and hence energy-absorbant) ends of the bar, and thus to reduce the distance between the electrodes and the ends of the bar for a given quality factor, $(N/2-1)$ slots (4), some of which may be omitted, are provided in each of these ends so that each end is divided into $N/2$ prongs (5) of equal width.

29 Claims, 4 Drawing Figures

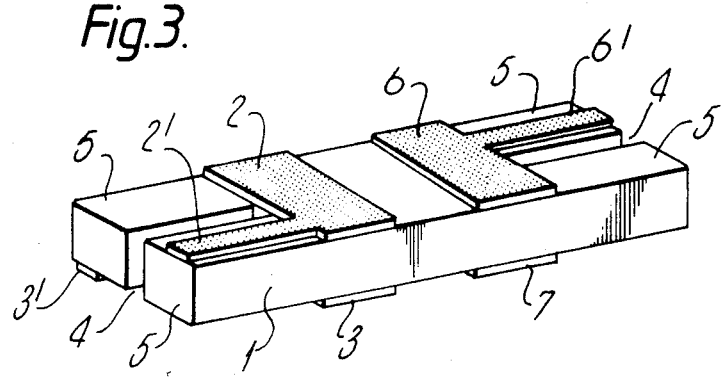
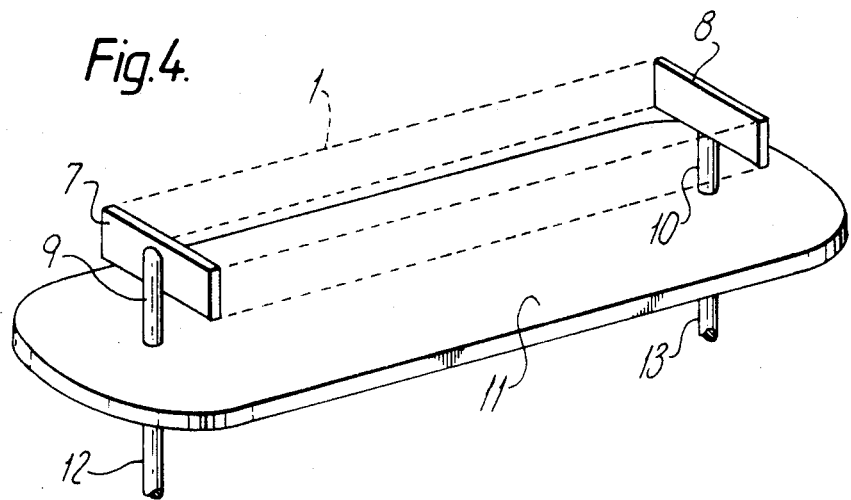

PIEZO-ELECTRIC RESONATOR OR FILTER HAVING SLOTS FORMED WHICH IMPEDE UNDESIRED VIBRATIONAL ENERGY

This invention relates to a resonator or filter comprising a rectangular bar of piezoelectric material which is supported at an end thereof and has rectangular cross-sections in planes perpendicular to its length direction. First and second electrodes are provided for exciting thickness shear vibrations in the material of the bar in a manner such that the displacement of said material due to said vibrations occurs in the width direction of the bar, said vibrations giving rise in turn to Nth harmonic flexure vibrations propagating in the width direction of the bar, where N is an even integer. The electrodes are provided on respective ones of the two major faces of the bar in a manner such that each extends across the full width of the bar but is spaced from the said end of the bar so that vibrational energy is hindered from propagating from the portion of the bar which lies between said electrodes to said end of the bar. The width to thickness ratio of said portion is such that N is greater than two for the first harmonic of said thickness shear vibrations. Resonators and filters of this general type are disclosed, for example in British patent specifications Nos. 1,572,810 and 1,553,343 respectively. Their basic shape is very simple, which makes them amenable to low-cost manufacture. in order to obtain a favourable temperature behaviour the bar may comprise AT-cut quartz, in which case it will have its length direction perpendicular to the X-axis of the quartz. An AT-cut is a rotated (about the X-axis) Y-cut where the angle of rotation is approximately 35°. If the bar is considered as an acoustic waveguide the inertia of, and piezoelectric shorting produced by, the electrodes result in the cut-off frequency, at least for some modes of vibration, of that portion of the guide which is located between the electrodes being below the resonant frequency of the resonator or filter and the cut-off frequency of the remainder of the guide being above this resonant frequency. The result is that vibrational energy is "trapped" between the electrodes, or at least is hindered from propagating from the portion of the bar between the electrodes to the said end of the bar. In fact the vibrational energy decays either exponentially or as a damped oscillation on going from the region between the electrodes towards the end of the bar. Therefore if there is a sufficient length of bar between the electrodes and the supported end, only a negligible amount of vibrational energy will be dissipated in the support, enabling the resonator or filter to have a high quality factor Q. For example, a 4.2 MHz resonator of the kind set forth, in which the bar is cut from AT-cut quartz, has dimensions of 0.4 mm×1.14 mm×10 mm. The bar is supported at both ends and, if the electrodes cover the centre third of respective ones of the two major faces, it can have a Q of the order of 500,000.

Such simple resonators do have the disadvantage however that, because all dimensions scale inversely with frequency (assuming that the same Q-performance is still required) the largest dimension (the bar length) becomes inconveniently high for many comparatively low-frequency applications. For example, at 1.4 MHz a typical resonator will have a bar length of 3 cm. One possible way of allowing the bar to be shortened is to arrange in some manner that the vibrational energy decays to a negligible value over a shorter distance on going from the region between the electrodes towards the supported end(s) of the bar. To this end, the bar may be profiled in such a manner that its thickness decreases, and hence the various cut-off frequencies increase, on going from the electroded region to the supported end(s). Thus, for example, the bar may be mesa-shaped. Such profiling is referred to in the aforesaid U.K. patent specification No. 1,572,810 and is also disclosed in U.K. patent specification No. 1,401,042 referred to therein. However, achieving it can considerably complicate the manufacturing process and therefore it is an object of the invention to provide an alternative solution which is less disadvantageous in this respect.

The invention provides a resonator or filter comprising a rectangular bar of piezoelectric material which is supported at an end thereof and has rectangular cross-sections in planes perpendicular to its length direction, and first and second electrodes for exciting thickness shear vibrations in the material of the bar in such a manner such that the displacement of said material due to said vibrations occurs in the width direction of the bar, said vibrations giving rise in turn to Nth harmonic flexure vibrations propagating in the width direction of the bar, where N is an even integer. These electrodes are provided on respective ones of the two major faces of the bar in such a manner that each extends across the full width of the bar but is spaced from the said end of the bar so that vibrational energy is hindered or impeded from propagating from the portion of the bar which lies between said electrodes to said end of the bar. The width to thickness ratio of said portion is chosen so that N is greater than two for the first harmonic of said thickness shear vibrations. The invention is characterized in that a slot is provided in said end of the bar. This slot extends in the length direction of the bar, is parallel to the two side faces of the bar, and has its centre situated at a distance of approximately $(2/N) \cdot m \cdot a$ from a given said side face, where a is the width of the bar and m is an integer smaller than N/2.

It has now been recognised that providing a slot in the part of the bar between the electrodes and the supported end in the manner specified (which means, inter alia, that the distance between the slot and each side of the bar is approximately an integral multiple of the wavelength of said flexure vibrations) enables said Nth harmonic flexure vibrations to be coupled strongly into lower (even harmonic flexural vibration modes in the "prongs" or "tines" created at the ends of the bar by the presence of the slot, and thus results in a similar form of vibration occurring in each prong as occurs between the electrodes. Because the aspect ratio (width to thickness ratio) of each prong is less than that of the corresponding section in the absence of the slot, e.g. a single centrally placed slot provides two prongs whose aspect ratio is less than half that which the end part of the bar would have in the absence of the slot, the cut-off frequencies of these prongs when they are treated as acoustical waveguides will be higher for the relevant vibration modes than would be the corresponding cut-off frequencies of the bar end in the absence of the slot, so that the rate of decay of the vibrational energy on going towards the bar end is increased. As a result, the length of the part of the bar between the electrodes and the said end can be significantly reduced while maintaining the same quality factor. It will be appreciated that such a slot can be provided much more easily than can the profiling referred to in the preamble. A plurality of suitably slotted bars can be produced from a plate of piezoelectric material using, for example, photolithographic techniques and selective etching, or laser cutting. Alternatively the slot may be produced by sawing.

It will often be required that the bar be supported at its other end, in which case it will be evident that it is advantageous that similar measures be taken at this other end. Thus, if said bar is also supported at its other end, preferably each said electrode is also spaced from said other end so that vibrational energy is also hindered from propagating from said portion to said other end of the bar. A slot is also provided in said other end, which slot extends in the length direction of the bar, is parallel to the two side faces of the bar, and has at its centre situated at a distance of approximately $(2/N)\cdot n\cdot a$ from a given said side face, where n is an integer smaller than N/2.

At least when the bar is made of AT-cut quartz, particularly advantageous values of N are four and eight because these are the lowest (even) values for which there is no strong coupling of the flexure vibrations to a face shear vibration mode (which would be likely to result in unpredictable and unreliable behaviour). Another such value is twelve. A particularly simple configuration is obtainable with these values of N, i.e. when N/2 is an even integer, if the or each slot merely bisects the relevant end of the bar. Thus, preferably, N/2 is an even integer and m (and n if relevant)=N/4.

If N is greater than four there is more than one possible value for m (and n if relevant), i.e. there is more than one possible position (in fact N/2−1 possible positions) for the slot in the or each end of the bar. In such a case the maximum rate of decrease of the vibrational energy on going towards the or each end of the bar can be obtained if a slot is provided in each of the possible positions. Consequently, when N is greater than four, preferably (N/2−1) slots are provided in the or each end of the bar, each of these slots extending in the length direction of the bar, being parallel to the two side faces of the bar, and having its centre situated at a distance of approximately $(2/N)\cdot m\cdot a$ from a said side face, m being different for each of the slots in a given end of the bar.

It will be evident that a minimum amount of vibrational energy will be propagated to a bar support if the prongs created by the slot(s) occupy as much of the length dimension of the bar as possible, i.e. extend over the whole distance between the relevant end of the bar and the said electrodes, and possibly even into the portion of the bar which lies between the electrodes. Thus, a slot preferably extends at least as far as said portion.

As mentioned in the preamble a favourable temperature performance (frequency-temperature stability) is obtainable if the bar is of AT-cut quartz and has its length direction perpendicular to the X-axis of the quartz. When this is the case the width to thickness ratio of the said portion of the bar is preferably such that N=4 or N=8, for the reason set forth hereinbefore. Although there is an appreciable tolerance on the width to thickness ratios of the said portion of such a quartz bar which result in these values for N, it has been found that the optimum temperature performacne is obtainable when said ratios are approximately 2.85 and 6.05 respectively.

Figure 2:
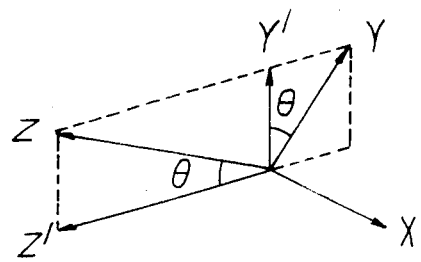
Figure 2:
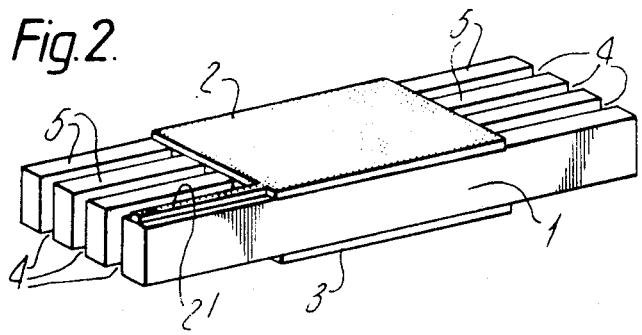

Embodiments of the invention will now be described, by way of example, with reference to the accompanying diagrammatic drawing in which:

FIG. 1 is a perspective view of the electroded bar portion of a prior art resonator as discussed in the preamble, together with a diagram indicating the orientation of the various crystal axes in the material of the bar, FIG. 2 is a perspective view of the electroded bar portion of a first embodiment of the invention, FIG. 3 is a perspective view of the electroded bar portion of a second embodiment of the invention, and FIG. 4 is a perspective view of a possible mounting or support arrangement for the portions of FIGS. 1 to 3.

In FIG. 1 a resonator as disclosed in U.K. patent specification No. 1,572,810 comprises a rectangular bar 1 of piezoelectric material, in this case AT-cut quartz, which is supported at both ends by support means (not shown). The bar 1 has rectagular cross-sections in planes perpendicular to its length direction and is provided with first and second electrodes 2 and 3 respectively for exciting thickness shear vibrations in the material of the bar in a manner such that the displacement of the bar material due to these vibrations occurs in the width direction of the bar. To this end the X-axis of the quartz lies in this width direction, as indicated in the coordinate diagram also included in FIG. 1. This diagram also shows the orientations of the other axes Y and Z of the quartz, Y' and Z' being the thickness and length directions respectively of the bar 1 and $\theta$ being approximately 35° (in fact 34°48'). The electrode 2 is provided with a connection 2 to one end of the bar so that electrical contact can be made thereto via the support and a similar connection (not visible in the Figure) is provided for the other electrode 3 to the other end of the bar. The thickness shear vibrations occurring in operation between the electrodes 2 and 3 give rise in turn to Nth harmonic flexure vibrations in the material of the bar, where N is an even integer, these vibrations propagating in the width direction of the bar. It will be evident that the value of N, i.e. the number of half-wavelengths present in the width direction of the bar 1, of the flexure vibrations set up in response to the occurrence of a first harmonic thickness shear vibration (a thickness shear vibration of a frequency (the resonant frequency of the resonator) such that one half-wavelength thereof is present in the thickness direction of the bar 1) is determined by the width to thickness ratio of the portion of the bar 1 between the electrodes 2 and 3. According to U.K. patent specification No. 1,553,343 a value for this ratio of between 1.1 and 1.9 gives rise to N=2, a value between 2.2 and 3.6 gives rise to N=4, a value between 3.6 and 5.3 gives rise to N=6, a value between 5.1 and 6.8 gives rise to N=8, a value between 6.5 and 8.4 gives rise to N=10 and a value between 8.0 and 10.4 gives rise to N=12.

Each electrode 2 and 3 extends across the full width of the bar 1 but is spaced from the two ends thereof. This results in a known manner in the "trappng" of the vibrational energy in the portion of the bar which lies between the two electrode. From this portion to the two bar ends the vibrational energy decays either exponentially or as a damped oscillation so that, provided the lengths of bar between this portion and the two bar ends are sufficient, only a negligible amount of vibrational energy is present at the two bar ends to be absorbed by the support. In order to assist this decay the ends of the bar 1 may be made thinner than the remainder thereof, enabling the length of the bar to be less than it would otherwise have to be to obtain a given quality factor Q. This thinning is, however, difficult and costly to achieve by mass production techniques. Moreover, the amount of thinning which can be provided is limited by the fact that there exists the possibility of mode conversion to untrapped modes at any discontinuities which may be present between the thinned portions of the bar and the unthinned portion thereof.

In FIG. 2, in which corresponding components have been given the same reference numerals as their counterparts in FIG. 1, a resonator in accordance with the invention again comprises a rectangular bar 1 of AT-cut quartz which is supported at both ends by support means (not shown). The crystal axes have the same relationship to the length, width and thickness directions of the bar 1 as they do to the corresponding directions of the bar 1 of FIG. 1. Again the bar 1 has rectangular cross-sections in planes perpendicular to its length direction and is provided with first and second electrodes 2 and 3 respectively so that similar acoustic vibrations are set up in operation in the portion of the bar 1 between these electrodes as are set up in the corresponding portion of the bar 1 in FIG. 1. The width to thickness ratio of the bar 1 in FIG. 2 is chosen to be in the range 5.1 to 6.8 (giving a value of eight for N as defined previously); a value of approximately 6.05 (i.e. between 5.8 and 6.3) is preferred for this ratio from the point of view of temperature stability. In contrast to the bar 1 of FIG. 1, for $N=8$, three slots i.e. $(N/2)-1=3$, are provided in each end of the bar 1 of FIG. 2.

The slots 4 each extend in the length direction of the bar as far as the electrodes 2 and 3 and are parallel to the two side faces of the bar. These slots divide each end of the bar into four prongs or tines 5 of approximately equal width, i.e. each slot has its centre situated at a distance of approximately $(2/N) \cdot m \cdot a$ from a given side face, where a is the width of the bar and m is an integer, different for each slot at a given end of the bar, which is smaller than $N/2$. The tolerance in each distance $(2/N) \cdot m \cdot a$ should be sufficiently tight to ensure that the width of each prong is less than would be if each said distance were exactly $(N/2N) \cdot m \cdot a$ and the width of each slot were infinitesimally small. The connection 2' extends along the top surface of one of the prongs to one end of the bar and the corresponding connection (not visible in the Figure) from the electrode 3 to the other end of the bar extends along the bottom surface of one of the prongs at this other end.

The resonator of FIG. 2 operates in a similar manner to that of FIG. 1, the only difference being the additional attenuation imparted to the vibrational energy escaping from the portion of the bar 1 situated between the electrodes 2 and 3 as it travels towards the two bar ends due to the presence of the slots 4. In the resonator of FIG. 2 the eighth-harmonic flexural vibrations in the centre section of the bar 1 excite second-harmonic flexural vibrations in each of the prongs 5, and these modes are attenuated very strongly in the prongs at the resonant frequency of the resonator because, if the prongs are considered as acoustic waveguides, the cut-off frequencies for said modes are appreciably higher than the frequencies of the relevant vibrations at the resonant frequency of the resonator. Thus the distance between the electrodes 2 and 3 and the ends of the bar 1 can be less when the slots 4 are provided than it would have to be if they were omitted and the same quality factor were required. In practice it has been found that providing the slots 4 makes it possible to obtain the same performance with a bar which is 25% shorter than that which would be required in their absence.

The widths of the slots 4 in FIG. 2 are not critical so that an increase thereof results in increased attentuation. Although some energy conversion to modes other than the second harmonic may take place with wider slots, this need not affect the quality factor Q of the resonator because these other modes are likely to be even more strongly attenuated. Obviously, making the slots very wide will drastically reduce the physical strength of the bar 1.

If desired one or two of the slots 4 at each end of the bar 1 in FIG. 2 may be omitted. If two are omitted at each end the remaining one is preferably the centre one.

In FIG. 3, in which corresponding components have been given the same reference numerals as their counterparts in FIGS. 1 and 2, a filter in accordance with the invention again comprises a rectangular bar 1 of AT-cut quartz which is supported at both ends by support means (not shown). The crystal axes have the same relationship to the length, width and thickness directions of the bar 1 as they do to the corresponding directions of the bar 1 of FIG. 1. Similarly to the bar 1 of FIGS. 1 and 2 the bar 1 of FIG. 3 has identical rectangular cross-sections in planes perpendicular to its length direction and is provided with electrodes 2 and 3 respectively on its two major faces. The electrodes again extend across the full width of the bar and are spaced from its two ends so that in operation similar acoustic vibrations are set up in the portion of the bar 1 between these electrodes as are set up in the corresponding portion of the bar 1 of FIGS. 1 and 2. The connection 3' which electrically connects the electrode 3 to one end of the bar now connects it to the same end of the bar as that to which the electrode 2 is connected by means of connection 2'. This is because, in the filter of FIG. 3, two further electrodes 6 and 7 are provided on the major faces of the bar 1 in an exactly similar way to, but spaced from, the electrodes 2 and 3. Thus each electrode 6 and 7 extends across the full width of the bar but is spaced from its two ends, and is provided with a connection (only one 6' of which is visible in the Figure) to the other end of the bar. The width to thickness ratio of the bar 1 in FIG. 3 is chosen to be in the range 2.2–3.6 (giving a value of four for N as defined previously); a value of approximately 2.85 (i.e. between 2.7 and 3.0) is preferred for this ratio from the point of view of temperature stability. Similarly to the bar 1 of FIG. 2, $(N/2-1)$ slots 4, i.e. in this case one slot 4, is provided in each end of the bar 1 of FIG. 3. These slots extend in the length direction of the bar as far as the electrodes 2 and 3 and the electrodes 6 and 7 respectively and are parallel to the two side faces of the bar. The slots 4 divide each end of the bar into two prongs or tines 5 of approximately equal width. Thus, similarly to the slots 4 of FIG. 2, each of the slots 4 of FIG. 3 has its centre situated at a distance of approximately $(2/N) \cdot m \cdot a$ from a given side face, where a is the width of the bar and m is an integer which is smaller than N. The connections 2' and 3' extend along the top and bottom surfaces respectively of respective prongs 5 at one end of the bar, and the corresponding connections to the electrodes 6 and 7 extend along the top and bottom surfaces respectively of respective prongs 5 at the other end of the bar.

The arrangement of FIG. 3 effectively comprises two resonators, each as shown in FIG. 1, mechanically coupled together in that the bar 1 is common to both. The length of bar between the electrodes 2, 3 and 6, 7 should obviously be sufficiently small that significant such coupling exists in spite of the trapping of vibrational energy which occurs between the electrodes 2 and 3 and the electrodes 6 and 7. Thus a filter is formed of which one pair of electrodes 2, 3 and 6, 7 constitutes the input and the other pair constitutes the output. Similarly to that which occurs in the resonator of FIG. 2, in the filter of FIG. 3 the fourth-harmonic flexural vibrations occurring in operation between the electrodes 2 and 3 and between the electrodes 6 and 7 excite second-harmonic flexural vibrations in the prongs 5, and these modes are attenuated very strongly in the prongs at the resonant frequency of the filter so that the distances between the electrodes 2, 3, 6, 7 and the nearest ends of the bar 1 can be less than would otherwise be required in order to obtain a given Q-factor.

Similar comments apply to the widths of the slots 4 of FIG. 3 as were made with respect to the widths of the slots 4 of FIG. 2.

The material of the various electrodes provided on the bars 1 of FIGS. 2 and 3 and of the various connections thereto may be, for example, aluminium or gold a few tenths of a micrometer thick. Although the bar 1 itself has been stated to be AT-cut quartz, other piezoelectric materials, for example, berlinite, lithium tantalate or lithium tetraborate may of course be used, provided that they are cut relative to their crystal axes in such a manner that the thickness shear vibrations set up in operation are such that the resulting displacement of the bar material occurs in the width direction thereof.

The width to thickness ratios of the bara 1 of FIGS. 2 and 3, together with the number of slots 4 provided in each end thereof, are, of course, interchangeable. Moreover, other width to thickness ratios may be used to give other even values for N/2. Thus, for example, a width to thickness ratio in the range 8.0 to 10.4, for example, approximately 9.2, may be used giving N=12 and making it possible to provide five slots (between one and four of which may in fact be omitted) in each end of the bar 1 thereby dividing that end into six equal-width prongs. As mentioned previously width to thickness ratios which produce values of N=6 and N=10 are not desirable.

The bar 1 of FIG. 2 may be supported in the manner shown in FIG. 4, i.e. the two ends thereof may be stuck to metal plates 7 and 8 respectively by means of an electrically conductive, for example silver loaded, epoxy resin (not shown). The plates 7 and 8 are welded in turn to metal posts 9 and 10 respectively which pass through and are fixed to a base plate 11 of electrically insulating material so that contact pins 12 and 13 are formed on the other side thereof. If desired an elongated dome-shaped cover may be provided over the components 1, 7, 8, 9, 10 and may be sealed to the edges of the support 11 in an air-tight manner, in which case the enclosure so formed is preferably evacuated. The bar 1 of FIG. 3 may be supported in a similar manner although, because two electrical connections are required to each end thereof, each of the plates 7 and 8 of FIG. 4 will have to be replaced by two plates each stuck to an individual one of the prongs 5 of FIG. 3 and being welded to its own post/contact pin.

It will be appreciated that it is not essential that the bar 1 of FIGS. 2 and 3 be supported at both ends. If the environment allows, it may only be supported at one end (provided that electrical connections are provided in some other manner to the or each electrode which was previously connected to the now unsupported end). In this case it will not matter if vibrational energy reaches the unsupported end so that the slots otherwise provided therein may be omitted, as may be the spacing between that end and the electrodes nearest thereto.

I claim:

1. An elongate element comprising a rectangular bar of piezoelectric material having two opposed side faces extending in the length direction of the rectangular bar and two parallel opposed end faces orthogonal to the side faces and having orthogonal edges that define the width and thickness dimesnions of the bar, the edge extending between the side faces defining the width dimension, the bar having a pair of opposed parallel major faces extending in the length direction between said two end faces and orthogonal thereto, said bar being supported at least at one end thereof and having first and second electrodes on respective ones of said major faces for exciting thickness shear vibrations in the material of the bar such that the displacement of said material due to said vibrations occurs in the width direction of the bar, said vibrations giving rise in turn to Nth harmonic flexure vibrations propagating in the width direction of the bar, where N is an even integer, said electrodes extending on the respective ones of the two major faces of the bar across the full width of the bar but being spaced from the said end of the bar so as to impede the propagation of vibrational energy from the portion of the bar which lies between said electrodes to said end of the bar, the width to thickness ratio of said portion being such that N is greater than two for the first harmonic of said thickness shear vibrations, and wherein the bar includes a slot in said end of the bar which extends in the length direction of the bar, is parallel to the two side faces of the bar, and has its centre situated at a distance of approximately $(2/N) \cdot m \cdot a$ from a given said side face, where a is the width of the bar and m is an integer smaller than N/2.

2. An element as claimed in claim 1, characterized in that said bar is also supported at its other end, each said electrode is also being spaced from said other end so as to impede vibrational energy from propagating from said portion to said other end of the bar, and a slot also being provided in said other end, which slot extends in the length direction of the bar, is parallel to the two side faces of the bar, and has its centre situated at a distance of approximately $(2/N) \cdot n \cdot a$ from a given said side face, where n is an integer smaller than N/2.

3. An element as claimed in claim 1 or claim 2, wherein N/2 is even integer and m=N/4.

4. An element as claimed in claim 3, characterized in that n=N/4.

5. An element as claimed in claim 2 wherein N is greater than four and a total of (N/2−1) slots are provided in the one end of the bar each of said slots extending in the length direction of the bar, being parallel to the two side faces of the bar, and having its centre situated at a distance of approximately $(2/N) \cdot m \cdot a$ from a said side face, m being different for each of the slots.

6. An element as claimed in claim 5 wherein (N/2−1) slots are provided in said other end of the bar, each of said slots extending in the length direction of the bar, being parallel to the two side faces of the bar, and having its centre situated at a distance of approximately $(2/N) \cdot n \cdot a$ from a said side face, n being different for each of the slots.

7. An element as claimed in claim 1 wherein the slot extends at least as far as said portion.

8. An element as claimed in claim 1 wherein said bar is of AT-cut quartz and has its length direction perpendicular to the X-axis of the quartz.

9. An element as claimed in claim 8, wherein the width to thickness ratio of said portion is chosen so that N=4.

10. An element as claimed in claim 9, wherein the width to thickness ratio of said portion is approximately 2.85.

11. An element as claimed in claim 8, wherein the width to thickness ratio of said portion is chosen so that $N=8$.

12. An element as claimed in claim 11, characterized in that the width to thickness ratio of said portion is approximately 6.05.

13. An element as claimed in claim 1 wherein $N/2$ is an even integer and $m=N/4$.

14. An element as claimed in claim 1 wherein $N>4$ and a total of $(N/2-1)$ slots are provided in the one end of the bar, each of said slots extending in the length direction of the bar, being parallel to the two side faces of the bar, and having its center situated at a distance of approximately $(2/N)\cdot m\cdot a$ from a said side face, m being different for each of the slots.

15. An element as claimed in claim 14 wherein $N/2$ is an even integer and $m=N/4$.

16. An element as claimed in claim 5 wherein $N/2$ is an even integer, $m=N/4$ and $n=N/4$.

17. An element as claimed in claim 5 wherein $N/2$ is an even integer and $m=N/4$.

18. An element as claimed in claim 2 wherein $N>4$ and said bar further comprises a total of $(N/2-1)$ slots in said other end of the bar, each of said slots in the other end of the bar extending in the length direction of the bar, being parallel to the two side faces of the bar, and having its center situated at a distance of approximately $(2/N)\cdot n\cdot a$ from a said side face, n being different for each of the other slots.

19. An element as claimed in claim 2 wherein each slot extends at least as far as said portion of the bar.

20. An element as claimed in claim 2 wherein said bar comprises AT-cut quartz with its length direction perpendicular to the X-axis of the quartz.

21. An element as claimed in claim 5 wherein said bar comprises AT-cut quartz with its length direction perpendicular to the X-axis of the quartz.

22. An element as claimed in claim 6 wherein said bar comprises AT-cut quartz with its length direction perpendicular to the X-axis of the quartz.

23. A piezoelectric device comprising: a rectangular bar of piezoelectric material having a pair of opposed major faces, a pair of opposed end faces and a pair of opposed side faces, the width direction of the bar corresponding to a line perpendicular to the pair of said faces and the length direction to a line perpendicular to the pair of end faces, said bar being supportable at at least one end thereof and said piezoelectric material having its X-axis extending in the width direction of the rectangular bar, first and second electrodes provided on respective ones of said pair of major faces of the bar so as to extend across the width of the bar but spaced from said one end of the bar thereby to excite thickness shear vibrations in the piezoelectric material such that the displacement of said material due to said vibrations occurs in the width direction of the bar, said vibrations causing Nth order harmonic flexure vibrations in the width direction of the bar, where N is an even integer, the width-to-thickness ratio of the portion of the bar between said electrodes being such that N is greater than two for the first harmonic of said thickness shear vibrations, and $(N/2)$-31 1 slots disposed in said one end of the bar which slots extend in the length direction of the bar and are parallel to said pair of side faces of the bar.

24. A device as claimed in claim 23 wherein $N=4$ and the thickness direction of the bar corresponds to a line perpendicular to the pair of major faces.

25. A device as claimed in claim 23 wherein the center of each slot is located at a distance $(2/N)\cdot m\cdot a$ from a given side face, where a is the width of the bar and m is an integer smaller than $N/2$.

26. A device as claimed in claim 25 wherein said device comprises a resonator in which $N/2$ is an even integer and $m=N/4$.

27. A device as claimed in claim 25 wherein said device comprises a filter in which $N/2$ is an even integer and $m=N/4$.

28. A device as claimed in claim 23 wherein said bar is also supportable at the other end thereof, said bar further comprising $(N/2)-1$ slots in said other end of the bar, said slots in the other end of the bar extending in the length direction of the bar and being parallel to said pair of side faces of the bar.

29. A device as claimed in claim 28 wherein the center of each slot in said one end of the bar is located at a distance $(2/N)\cdot m\cdot a$ from a given side face, where a is the width of the bar and m is an integer smaller than $N/2$, and wherein the center of each slot in said other end of the bar is located at a distance $(2/N)\cdot n\cdot a$ from said given side face, where n is an integer smaller than $N/2$.

* * * * *

UNITED STATES PATENT AND TRADEMARK OFFICE
CERTIFICATE OF CORRECTION

PATENT NO. : 4,583,063

DATED : April 15, 1986

INVENTOR(S) : ROBERT F. MILSOM

It is certified that error appears in the above-identified patent and that said Letters Patent is hereby corrected as shown below:

IN THE ABSTRACT: line 12, change "(N/2-1)" to --(N/2)-1--.

IN THE SPECIFICATION:

Column 5, line 37, change "(N/2N)" to --(2/N)--.

Column 6, line 44, change "(N/2-1)" to --(N/2)-1--.

IN THE CLAIMS:

Column 8, line 35, delete "is";

line 48, change "(N/2-1)" to --(N/2)-1--;

line 49, after "bar" insert --,-- (comma);

line 54, change "(N/2-1)" to --a total of (N/2)-1--.

UNITED STATES PATENT AND TRADEMARK OFFICE
CERTIFICATE OF CORRECTION

PATENT NO. : 4,583,063

DATED : April 15, 1986

INVENTOR(S) : ROBERT F. MILSOM

It is certified that error appears in the above-identified patent and that said Letters Patent is hereby corrected as shown below:

IN THE CLAIMS:

Column 9, line 13, change "(N/2-1)" to --(N/2)-1--;

line 26, change "(N/2-1)" to --(N/2)-1--;

line 48, change "said" to --side--.

Column 10, line 17, change "(N/2)-31 1" to --(N/2)-1--.

Signed and Sealed this

Ninth Day of December, 1986

Attest:

DONALD J. QUIGG

Attesting Officer

Commissioner of Patents and Trademarks